US012753487B2

(12) United States Patent
Braun

(10) Patent No.: US 12,753,487 B2
(45) Date of Patent: Oct. 6, 2026

(54) METHOD FOR CONTROLLING A FLUX DISTRIBUTION OF EVAPORATED SOURCE MATERIAL, DETECTOR FOR MEASURING ELECTROMAGNETIC RADIATION REFLECTED ON A SOURCE SURFACE AND SYSTEM FOR THERMAL EVAPORATION WITH ELECTROMAGNETIC RADIATION

(71) Applicant: MAX-PLANCK-GESELLSCHAFT ZUR FÖRDERUNG DER WISSENSCHAFTEN E.V., Munich (DE)

(72) Inventor: Wolfgang Braun, Bietigheim-Bissingen (DE)

(73) Assignee: Max-Planck-Gesellschaft zur Förderung der Wissenschaften e.V., Munich (DE)

( * ) Notice: Subject to any disclaimer, the term of this patent is extended or adjusted under 35 U.S.C. 154(b) by 697 days.

(21) Appl. No.: 18/013,854

(22) PCT Filed: Jun. 30, 2020

(86) PCT No.: PCT/EP2020/068388

§ 371 (c)(1),
(2) Date: Dec. 29, 2022

(87) PCT Pub. No.: WO2022/002367

PCT Pub. Date: Jan. 6, 2022

(65) Prior Publication Data

US 2023/0287556 A1 Sep. 14, 2023

(51) Int. Cl.
*C23C 14/28* (2006.01)
*C23C 14/54* (2006.01)
(Continued)

(52) U.S. Cl.
CPC ............ *C23C 14/28* (2013.01); *C23C 14/543* (2013.01); *G01J 5/042* (2013.01); *G01J 5/12* (2013.01); *G01K 7/02* (2013.01); *G01K 17/185* (2013.01)

(58) Field of Classification Search
CPC ....... C23C 14/28; C23C 14/52; C23C 14/542; C23C 14/543; C23C 14/243;
(Continued)

(56) References Cited

U.S. PATENT DOCUMENTS 3,574,650 A * 4/1971 House .................. G01F 23/292 250/203.2
5,156,459 A 10/1992 Baker
(Continued)

FOREIGN PATENT DOCUMENTS

CN 101403637 A 4/2009
CN 104772568 A 7/2015
(Continued)

OTHER PUBLICATIONS

International Search Report mailed Jun. 7, 2021 corresponding to International Application PCT/EP2020/068388, 21 pages.
(Continued)

*Primary Examiner* — Michael P Wieczorek
(74) *Attorney, Agent, or Firm* — Dickinson Wright PLLC

(57) ABSTRACT

The present invention relates to a method for controlling a flux distribution (30) of evaporated source material (20) in a system (10) for thermal evaporation with electromagnetic radiation (120), wherein the system (10) comprises an electromagnetic radiation source (110) for providing an electromagnetic radiation (120), a vacuum chamber (12) containing a reaction atmosphere (16) and a detector (40) for measuring electromagnetic radiation (120), wherein a source material (20) and a target material (18) to be coated are
(Continued)

Figure 1:
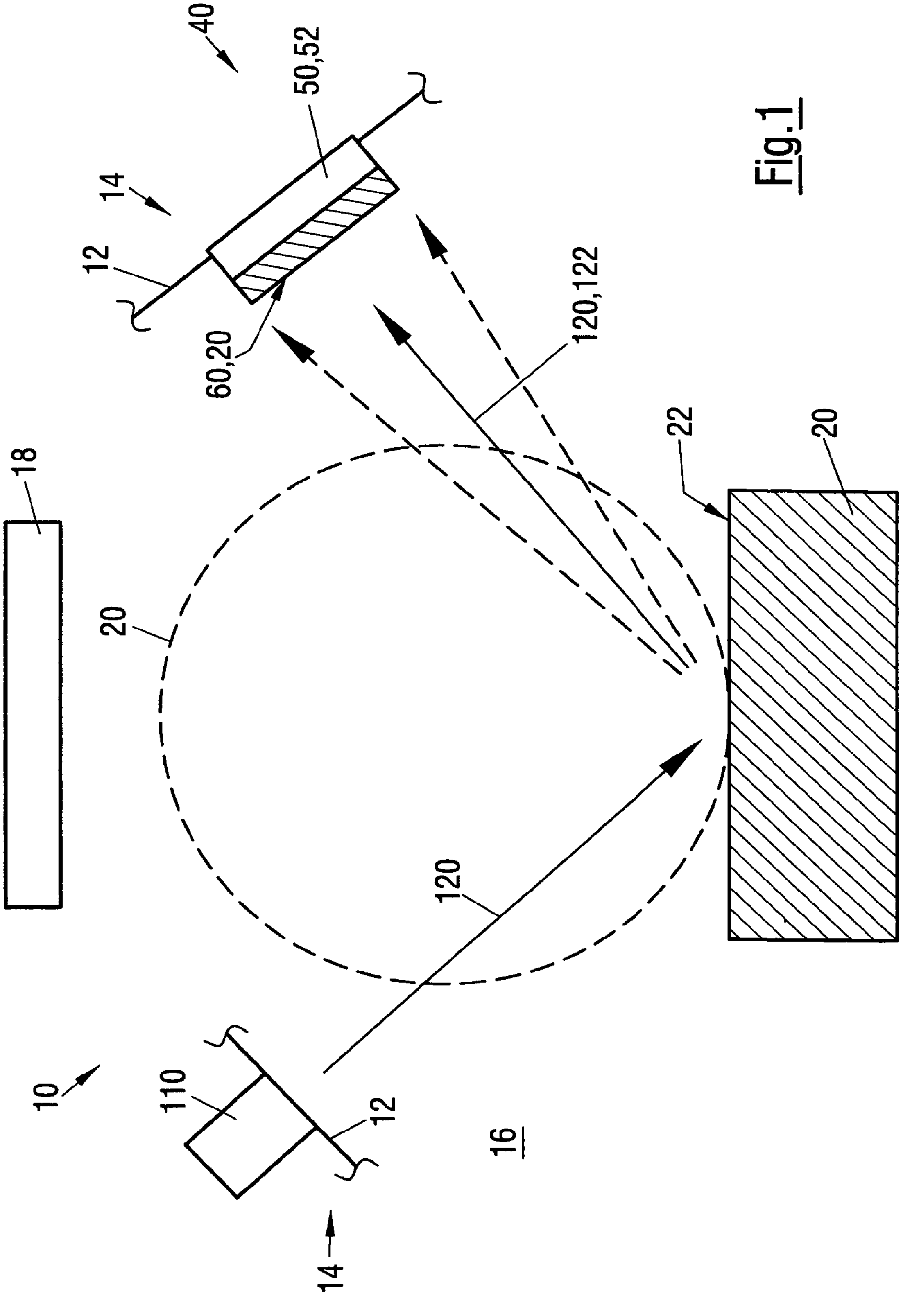

arranged in the vacuum chamber (12) and the radiation source is arranged such that its electromagnetic radiation (120) impinges at an angle, preferably at an angle of 45°, on a source surface (22) of the source material (20) for a thermal evaporation and/or sublimation of the source material (20) below the plasma threshold, and wherein the detector (40) for measuring electromagnetic radiation (120) is arranged such that electromagnetic radiation (120) reflected on the source surface (22) reaches the detector (40). Further, the present invention relates to a detector (40) for measuring electromagnetic radiation (120), the detector (40) preferably suitable for a method according to the present invention, and additionally to a system (10) for thermal evaporation with electromagnetic radiation (120) suitable for the method according to the present invention.

8 Claims, 12 Drawing Sheets

(51) Int. Cl.

| | |
|---|---|
| ***G01J 5/04*** | (2006.01) |
| ***G01J 5/12*** | (2006.01) |
| ***G01K 7/02*** | (2021.01) |
| ***G01K 17/18*** | (2006.01) |

(58) Field of Classification Search

CPC ....... C23C 14/246; C23C 14/24; C23C 14/54; C23C 14/30; C23C 14/32

See application file for complete search history.

(56) References Cited

U.S. PATENT DOCUMENTS

| | | | | |
|---|---|---|---|---|
| 5,612,887 | A | 3/1997 | Laube et al. | |
| 5,884,235 | A | 3/1999 | Ebert | |
| 2012/0258239 | A1* | 10/2012 | Hoffmann .............. | H10K 71/16 118/712 |
| 2020/0025608 | A1 | 1/2020 | Kramer | |

FOREIGN PATENT DOCUMENTS

| | | | |
|---|---|---|---|
| CN | 110836725 | A | 2/2020 |
| EP | 2133675 | A1 | 12/2009 |
| FR | 2584184 | A1 | 1/1987 |
| JP | 2000212733 | A | 8/2000 |
| JP | 2009294069 | A | 12/2009 |
| JP | 2019531466 | A | 10/2019 |
| JP | 2020072231 | A | 5/2020 |
| KR | 100745619 | B1 | 8/2007 |
| TW | 201544616 | A | 12/2015 |

OTHER PUBLICATIONS

First Office Action dated May 23, 2024 corresponding to Chinese Application No. 2020801026286, 10 pages.

Notice of Reasons for Refusal dated May 30, 2024 corresponding to Japanese Patent Application No. 2022-574401, 6 pages.

Translation of Notice of Reasons for Refusal dated Feb. 28, 2025 corresponding to Japanese Patent Application No. 2022-574401, 6 pages.

Machine Translation of Non-Final Rejection dated Jan. 3, 2025 corresponding to Taiwanese Patent Application No. 110123803, 16 pages.

* cited by examiner

METHOD FOR CONTROLLING A FLUX DISTRIBUTION OF EVAPORATED SOURCE MATERIAL, DETECTOR FOR MEASURING ELECTROMAGNETIC RADIATION REFLECTED ON A SOURCE SURFACE AND SYSTEM FOR THERMAL EVAPORATION WITH ELECTROMAGNETIC RADIATION

CROSS-REFERENCES TO RELATED APPLICATIONS

This application is a 371 National Phase Application of International Application PCT/EP2020/068388, filed on Jun. 30, 2020, which is incorporated herein by reference, in its entirety.

The present invention relates to a method for controlling a flux distribution of evaporated source material in a system for thermal evaporation with electromagnetic radiation, wherein the system comprises an electromagnetic radiation source for providing an electromagnetic radiation, a vacuum chamber containing a reaction atmosphere and a detector for measuring electromagnetic radiation, wherein a source material and a target material to be coated are arranged in the vacuum chamber and the radiation source is arranged such that its electromagnetic radiation impinges at an angle, preferably at an angle of 45°, on a source surface of the source material for a thermal evaporation and/or sublimation of the source material below the plasma threshold, and wherein the detector for measuring electromagnetic radiation is arranged such that electromagnetic radiation reflected on the source surface reaches the detector.

Further the invention relates to a detector for measuring electromagnetic radiation reflected on a source surface, comprising a sensor element with an absorption body, the absorption body comprising an absorption surface for at least partly absorbing the electromagnetic radiation, wherein the sensor element further comprises a heat sensing element for measuring a temperature of the absorption body for detecting an absolute temperature and/or a temperature change caused in the absorption body by the absorbed electromagnetic radiation.

In addition, the invention relates to a system for thermal evaporation with electromagnetic radiation, comprising an electromagnetic radiation source for providing an electromagnetic radiation, a vacuum chamber containing a reaction atmosphere and a detector for measuring electromagnetic radiation, wherein a source material and a target material to be coated are arranged in the vacuum chamber and the electromagnetic radiation source is arranged such that its electromagnetic radiation impinges at an angle, preferably at an angle of 45°, on the source surface of the source material for a thermal evaporation and/or sublimation of the source material below the plasma threshold, wherein the detector for measuring electromagnetic radiation is arranged such that electromagnetic radiation reflected on the source surface reaches the main detector.

The usage of electromagnetic radiation, in particular laser light with a wavelength in the visible, infrared or ultra-violet range, for an evaporation of source material is commonly known. Such laser evaporation systems allows the deposition of thin films of materials at low pressures by heating the center of a block of source material with a continuous wave laser from the front side. For example, silicon melts at the temperatures required to achieve the desired flux of evaporated material, forming a melt pool inside a solid portion of the same source material. The solid Si therefore forms a crucible for the liquid Si, allowing for very high heating and cooling rates due to the absence of a thermal expansion mismatch between source material and crucible. At the same time, any contamination of the source material by a different crucible material is avoided. Alternatively, also crucibles consisting of a material different to the material to be evaporated are used.

However, as the source material is depleted by the impinging electromagnetic radiation, the source surface changes its shape as for instance a melt pool develops a concave form and/or a sublimation spot digs deeper and deeper into the source material. A flux distribution and an evaporation rate of evaporated material therefore are inherently unstable as the shape of the source surface directly influences the aforementioned flux distribution and evaporation rate of the evaporated material.

In general, two main cases may be distinguished. In the situation of a locally concave sublimating or evaporating, a concave dip underneath the spot or the electromagnetic radiation forms as the sublimation or evaporation rate is largest at the center of this spot due to the radial intensity decay of the electromagnetic radiation within the beam and the thermal gradient away from the intensity maximum. Moving outward from the deepest point of this dip, the surface elements are inclined inwards towards the source symmetry axis, thereby contributing more to the center of the flux distribution. Such a focusing of the flux distribution might even be favorable, especially if small samples are to be coated at relatively large distances. However, once the dip in the source surface becomes too deep, evaporation or sublimation from its sidewall surface elements is inclined too much, and the flux distribution defocuses again. Furthermore, the steep sidewalls may shadow some parts of the mole to be coated, leading to a strong thickness inhomogeneity.

A locally convex sublimating or evaporating surface is the second main situation. Here, the surface elements away from the symmetry axis of the source are tilted outwards, leading right away to a more diffuse flux distribution in which more material is directed besides the sample as compared to the case of a flat surface. Such a defocused flux distribution might lead to a reduced growth rate on the target substrate, whereby the amount of sublimated or evaporated source material missing the target is larger than in the case of a flat source surface.

In general, a known approach to overcome this problem is to move the spot of the electromagnetic radiation on the source material to obtain a more even distribution energy deposit and hence of the flux distribution of the evaporated source material. However, to provide an actual active control of a flux distribution, a reliable detection of the surface curvature underneath the spot of the electromagnetic radiation is necessary. A direct observation of the source surface with a camera is hindered by the rapid coating of any window facing the source surface and therefore the evaporation or sublimation flux.

In view of the above, it is an object of the present invention to provide an improved method for controlling a flux distribution of evaporated source material, an improved detector for measuring electromagnetic radiation reflected on a source surface and an improved system for thermal evaporation with electromagnetic radiation which do not have the aforementioned drawbacks of the state of the art. In particular, it is an object of the present invention to provide a method, a detector and a system which allow a control of a flux distribution of evaporated source material in a system for thermal evaporation with electromagnetic radiation in an especially easy and cost-efficient way, wherein preferably the flux distribution can be adjusted for spatial variations with respect to shape, size and direction, respectively, in particular in a closed loop control.

This object is satisfied by the respective independent patent claim. In particular, this object is satisfied by a method according to claim 1. The dependent claims describe preferred embodiments of the invention. Details and advantages described with respect to the method according to the first aspect of the invention also refer to a detector according to the second aspect of the invention and to a system according to the third aspect of the invention and vice versa, if of technical sense.

According to a first aspect of the invention, the object is satisfied by a method for controlling a flux distribution of evaporated source material in a system for thermal evaporation with electromagnetic radiation, wherein the system comprises an electromagnetic radiation source for providing an electromagnetic radiation, a vacuum chamber containing a reaction atmosphere and a detector for measuring electromagnetic radiation, wherein a source material and a target material to be coated are arranged in the vacuum chamber and the radiation source is arranged such that its electromagnetic radiation impinges at an angle, preferably at an angle of 45°, on a source surface of the source material for a thermal evaporation and/or sublimation of the source material below the plasma threshold, and wherein the detector for measuring electromagnetic radiation is arranged such that electromagnetic radiation reflected on the source surface reaches the detector.

The method according to the present invention comprises the following steps:

a) defining a desired distribution of a flux of source material evaporated from the source surface and an impinging distribution of electromagnetic radiation required for the desired distribution,
b) determining an expected distribution of electromagnetic radiation reflected on the source surface based on the desired distribution and the impinging distribution of step a),
c) providing electromagnetic radiation with the required impinging distribution defined in step a) by the electromagnetic radiation source,
d) measuring electromagnetic radiation reflected on the source surface by the detector,
e) determining a measured distribution of electromagnetic radiation reflected on the source surface based on the measurement data of step d),
f) determining differences between the expected distribution determined in step b) and the measured distribution determined in step e),
g) redetermining the required impinging distribution of electromagnetic radiation provided by the electromagnetic radiation source to minimize the differences determined in step f), and
h) providing electromagnetic radiation with the required impinging distribution redetermined in step g) by the electromagnetic radiation source.

A method according to the present invention can be used in and by a system for thermal evaporation of a source material with electromagnetic radiation. In the following, the term evaporation also includes any sublimation processes, even if not explicitly mentioned. The evaporated source material can preferably be used to coat a target material, for instance in the form of a thin film. The source material and the target material are placed in a vacuum chamber of the system, wherein the vacuum chamber contains a reaction atmosphere suitable for the desired coating of the target material. For instance, the reaction atmosphere can be provided as a vacuum or contain required reaction gases like oxygen and/or nitrogen.

For the evaporation process, the electromagnetic radiation source provides the electromagnetic radiation, which is led into the vacuum chamber and impinges on the source surface of the source material. The energy deposit of the electromagnetic radiation evaporates or sublimates the source material. The energy deposit is chosen such that the plasma threshold of the source material is not reached. Hence, a purely thermal evaporation of the source material, especially without any forming of plasma, can be provided. By impinging at an angle, preferably an angle of 45°, a conflict of the path of the electromagnetic radiation in the vacuum chamber with other structures in the vacuum chamber such as source and/or target holding elements, can be avoided.

Only a fraction of the electromagnetic radiation impinging on the source surface is absorbed by the source material and used for the evaporation process. The remaining part of the electromagnetic radiation is reflected on the source surface. In other words, the absorbed part and the reflected part of the electromagnetic radiation are directly linked to each other. In particular, the reflected part of the electromagnetic radiation carries information of the shape and form of the surface, as for instance flat, concave and convex sections of the surface reflect the impinging electromagnetic radiation differently. Thereby the shape and form of the surface is impressed onto the reflected electromagnetic radiation. Hence, by detecting the electromagnetic radiation reflected on the source surface, the actual shape and form of the source surface can be deducted. For the detection of the reflected electromagnetic radiation, in the method according to the present invention a detector is used, suitably positioned within the vacuum chamber in the path of the reflected electromagnetic radiation.

As described above, the measured reflected electromagnetic radiation allows deducing the actual shape and form of the source surface. Hence, also the actual distribution of the flux of evaporated or sublimated source material can be determined. As the desired flux distribution is known, it can be determined how the impinging electromagnetic radiation has to be formed to produce the desired flux distribution when impinging on the actual present source surface.

Hereinafter the individual steps of the method according to the present invention are described in detail.

In the first step a) of the method according to the present invention, a desired distribution of a flux of source material evaporated from the source surface is defined. In most of the cases, the desired flux distribution will be such that a uniform coating of the target can be achieved. Nevertheless, also different, especially spatially dependent desired flux distributions are possible to provide coatings on targets with a position dependent thickness.

In addition, step a) also includes defining the impinging distribution of the electromagnetic radiation. This impinging distribution is defined such that the desired distribution of the flux of the evaporated source material can be provided. Besides the desired flux distribution, also the initial form and shape of the source surface, which is in most of the cases flat and/or circular, can preferably be considered during the definition of the impinging distribution of the electromagnetic radiation.

In the next set b) of the method according to the present invention, based on the results of step a), an expected distribution of electromagnetic radiation reflected on the source surface is determined. In particular, the desired distribution and the impinging distribution are used to determine the expected distribution. Similar to step a), also the initial form and shape of the source surface can additionally be considered during the determination of the expected distribution of the electromagnetic radiation.

In the following step c) of the method according to the present invention, the electromagnetic radiation is provided with the required impinging distribution defined in step a) by the electromagnetic radiation source. The electromagnetic radiation source can be attached directly to the vacuum chamber. Alternatively, the electromagnetic radiation source can be positioned spaced apart from the vacuum chamber, even in a different room or building, and the electromagnetic radiation can be guided to the vacuum chamber by suitable guiding elements, for instance optical fibers. As a result, the electromagnetic radiation impinges with the required impinging distribution on the source surface of the source material and thermally evaporates or sublimates source material below the plasma threshold.

Simultaneously, the part of the electromagnetic radiation not absorbed by the source material is reflected on the source surface. In the following step d) of the method according to the present invention, this reflected electromagnetic radiation is measured by the detector of the system. For this purpose, the detector is suitably positioned within the vacuum chamber.

The measurement data obtained in step d) of the method according to the present invention is analyzed in the subsequent step e). In particular, a measured distribution of electromagnetic radiation is determined based on the measurements of step d).

The information about the measured distribution obtained in step e) is used in the next step f) to determine differences between the expected distribution determined in step b) and the measured distribution determined in step e). In other words, after execution of step f) information is generated whether the expected distribution is met by the actual measured distribution. The larger the discrepancies between these two distributions are, the more will also the actual flux distribution of the evaporated source material differ from the desired distribution defined in step a) of the according to the present invention.

Based on the findings of step f), in the subsequent step g) of the method according to the present invention, the required impinging distribution is redetermined. In particular, the measured distribution and its differences to the expected distribution allow obtaining information about the actual shape and form of the source surface. Hence, based on this an improved determination of the required impinging distribution of electromagnetic radiation is possible to achieve the desired distribution of the flux of evaporated source material. By this, automatically the differences determined in step f) should be minimized.

In the last step h) of the method according to the present invention, the electromagnetic radiation is provided with the required impinging distribution redetermined in step g) by the electromagnetic radiation source. As a result, the electromagnetic radiation impinges with the redetermined required impinging distribution on the source surface of the source material and thermally evaporates or sublimates source material below the plasma threshold. As the actual shape and form of the source surface are considered, the match between the desired distribution and the actual present distribution of the flux of evaporated source material will be improved.

In summary, the method according to the present invention described above allows an active adjustment of the flux distribution of the evaporated or sublimated source material during the operation of the respective evaporation system based on actual measurements. Hence, a control of the flux distribution is possible. Consequently, the coating of target material can also be improved.

Further, the method according to the present invention can comprise that the desired distribution defined in step a) comprises a time dependence. A time dependence with respect to the present invention can for instance apply to a spatial shape and/or orientation of the desired distribution. Alternatively or additionally, also an intensity of the desired distribution can vary over time. As result, the coating of the target can be controlled in a very specific way, including for instance spatial thickness variations of the coating of the target material. Preferably, as the desired distribution is time dependent, the remaining steps of the method according to the present invention are accordingly adapted, namely for instance that also the required distribution and the expected distribution comprise an adjusted time dependence, and that the measurement, comparison and redetermination in step d), f) and g), respectively, are repeatedly carried out to follow this time dependencies.

In addition, the method according to the present invention can be characterized in that the expected distribution in step b) is determined by calculating the expected distribution and/or experimentally measuring the expected distribution and/or empirically estimating the expected distribution. This list is not closed, in particular also different methods of determining the expected distribution can be applied, if possible and of technical sense. Calculating the expected distribution is based on all accessible information, for instance the desired distribution and the required distribution. An empirical estimate is based on general assumptions like for instance an assumed form and shape of the source surface. Preferably, a combination of calculation and estimation is applied. By experimentally measuring the expected distribution a very accurate expected distribution can be provided. Drawback of this method is time and effort necessary for the additional experimental measurement.

Preferably, the method according to the present invention can comprise that steps d) to h) are repeatedly carried out. The repetition rate can be steady, for instance 10 Hz or even higher up to a continuous repetition of steps d) to h). Also an adapted repetition rate is possible, whereby the respective repetition can be triggered manually and/or if a parameter of the system exceeds or falls below a threshold, like for instance an energy deposit into the detector by the electromagnetic radiation reflected on the source surface. The repetition of steps d) to h) provides the possibility that the provision of the desired distribution can be ensured over a prolonged period of time. In particular, the repetitions allow a closed loop control of the provision of a flux of evaporated or sublimated source material with the desired distribution.

Further, the method according to the present invention can comprise that as the electromagnetic radiation light, in particular laser light, with a wavelength between 100 nm and 1400 nm is used. Light, in particular laser light, is easy to provide and in particular can be easily guided from light sources spaced apart from the vacuum chamber to the vacuum chamber. In particular, light can also be provided with a wide range of energy densities and hence a provision of electromagnetic radiation for evaporation below the plasma threshold of the specific source material can easily be provided.

According to another embodiment the method according to the present invention can be characterized in that in step e) and/or f) a response function of the detector is considered.

The response function of the detector has an immediate influence on the measurement of the reflected electromagnetic radiation. For instance, the solid angle covered by the detector limits the measured signal. Also a dead time of the detector and for instance an energy dependence of the sensitivity of the detector can influence the actual measurement. Hence, by considering the response function in step e) and/or f), the influence of the detector setup onto the measured distribution can be taken into account at least partly, preferably completely.

Additionally or alternatively, the method according to the present invention can comprise that in step f) a size and/or shape of the expected distribution and the measured distribution are used for determining the differences. As mentioned above, changes in the shape and/or form of the source surface influence the distribution of the reflected electromagnetic radiation. In particular, both concave and convex sections of the source surface, respectively, reflect the impinging electromagnetic radiation differently, in particular they disperse the incoming electromagnetic radiation. Thereby the shape and form of the surface is impressed onto the shape and form of the reflected electromagnetic radiation. Hence, by detecting a size and/or shape of the electromagnetic radiation reflected on the source, the information of the shape and/or form of the source surface imprinted onto the reflected electromagnetic radiation can be detected especially easily.

Further, the method according to the present invention can be characterized by that the electromagnetic radiation source comprises two or more emitter sections, whereby in step c) and h) each emitter section provides electromagnetic radiation impinging on the source surface, and wherein the system respectively comprises two or more detectors, each detector being accordingly arranged to measure electromagnetic radiation provided by one of the emitter sections and reflected on the source surface. In other words, according to this embodiment the source surface is illuminated by two separate beams of electromagnetic radiation, whereby each beam is monitored by a separate dedicated detector. Each pair of emitter section and assigned detector is enabled to carry out the emitting and measuring elements of the method according to the present invention. In summary, a more even distribution of the electromagnetic radiation impinging on the source surface, and in the following also an active control of this distribution as described above for an electromagnetic radiation source with a single emitter, can be provided. This also improves the smoothness of the possibly providable desired distributions.

Additionally, the method according to the present invention can be improved by that the respective electromagnetic radiation provided by the two or more emitter sections impinges radially symmetrically on the source surface. In other words, the emitter sections are evenly distributed around the source surface. As result, if the impinging distributions of the two or more emitter sections are equal, also the combined impinging distributions are rotational symmetric. In particular, effects like a leaning and/or tilting of melted source material in the direction of the impinging electromagnetic radiation can thereby be prohibited.

A further improved embodiment of the method according to the present invention can be characterized in that the two or more emitter sections provide electromagnetic radiation with adjustable power densities and/or shapes and/or sizes. As already described above, in some cases it can be advantageous to provide a required distribution which comprises a spatial distribution on the source surface. This can be easily provided with two or more emitter sections, whereby each of the emitter section can emit electromagnetic radiation, the individual power density, shape and/or size of which can be separately altered. In summary, this allows a desired distribution of the flux of source material to be evaporated from the source surface dependent on a position on the source surface.

According to a second aspect of the present invention, the object is satisfied by a detector for measuring electromagnetic radiation reflected on a source surface, comprising a sensor element with an absorption body, the absorption body comprising an absorption surface for at least partly absorbing the electromagnetic radiation, wherein the sensor element further comprises a heat sensing element for measuring a temperature of the absorption body for detecting an absolute temperature and/or a temperature change caused in the absorption body by the absorbed electromagnetic radiation, wherein the heat sensing element comprises a temperature sensor, in particular a thermocouple element, arranged in a bore in the absorption body, wherein the bore ends within the absorption body, preferably in the vicinity of the absorption surface.

A detector according to the present invention can be used in a system for thermal evaporation with electromagnetic radiation. In particular, such a detector can be used to measure the electromagnetic radiation, for instance electromagnetic radiation reflected on a source surface of a source material.

The electromagnetic radiation to be measured impinges on the absorption body, in particular onto the absorption surface, and is at least partly absorbed by the absorption surface. In other words, at least a fraction of the energy of the electromagnetic radiation is deposited into the absorption body. Hence measuring and monitoring, respectively, of a temperature of the absorption body allows to determine the energy deposited into the absorption body and thereby to determine the amount of electromagnetic radiation impinging on the absorption surface.

The absorption surface faces the source surface at least partly. Therefore the absorption surface gets coated with the source material evaporated or sublimated of the source. After a sufficiently long deposition, the detector therefore has the same, which also implies a constant, absorptivity and reflectivity as the source.

The absorption surface can be for instance aligned perpendicular to an assumed impinging direction of the electromagnetic radiation to be measured. As only part of the impinging electromagnetic radiation will be absorbed, the remaining part will be reflected back into the same direction. In a system for thermal evaporation, in which the detector according to the present invention is used to measure electromagnetic radiation reflected on a source surface, the electromagnetic radiation reflected on such an absorption surface is directed back onto the source surface and can be used for thermal evaporation for a second time.

However, a subsequent second reflection on the source surface leads the electromagnetic radiation back to the electromagnetic radiation source and can cause disturbances. An embodiment of the absorption surface with two flat sections arranged adjacent to each other in an angle slightly less than 90°, for instance 89°, can solve this issue. The electromagnetic radiation can still be reflected back onto the source surface, but not exactly in the same direction and thereby missing the electromagnetic radiation source. In addition, as the electromagnetic radiation impinging on the two-fold absorption surface is reflected twice, also absorption of the impinging electromagnetic radiation by the absorption surface is doubled. The energy deposit into the absorption body and hence the precision of the measurement can thereby be enhanced.

To measure and/or monitor the amount of energy deposited into the absorption body by the impinging electromagnetic radiation, an absolute temperature and/or a change of the temperature of the absorption body can be measured and/or monitored. In the detector according to the present invention, this measurement is carried out by using a temperature sensor arranged within the absorption body in a bore in the vicinity of the absorption surface.

The bore allows arranging the temperature sensor near to the absorption surface and hence to improve the accuracy of the temperature measurement. By the temperature sensor within the absorption body, the actual temperature of the absorption body and/or a change of this temperature can be directly measured. Hence, an absolute value of an energy deposit caused by absorbed electromagnetic radiation into the absorption body can be determined. Especially, based on the measurements of the detector according to the present invention for instance of electromagnetic radiation reflected on a source surface, a measured distribution of the electromagnetic radiation reflected on the source surface, and in the following an according match of an actual distribution of evaporated source material to a desired distribution of evaporated source material, can be deducted and subsequently be controlled.

Preferably, the detector according to the present invention comprises that the detector is usable in a method according to the first aspect of the invention. Hence all features and advantages described in detail with respect to a method according to the first aspect of the present invention can also be provided by the detector according to the second aspect of the present invention used for carrying out the method according to the first aspect of the present invention.

In addition, the detector according to the present invention can be characterized in that the absorption surface absorbs light, in particular laser light, with a wavelength between 100 nm and 1400 nm. As mentioned above with respect to the method according to the first aspect of the present invention, light, in particular laser light, is suitable for an evaporation and/or sublimation of a broad range of possible source materials. By providing an absorption surface capable of absorbing light, the detector according to the present invention can be adapted to this special electromagnetic radiation. The adaptation can for instance include a suitable material chosen for the absorption body, on which the absorption surface is arranged. Additionally or alternatively, also an adaptably chosen coating of the absorption surface for an enhancement of absorption of light can be used.

According to another embodiment of the detector according to the present invention, the absorption body comprises a cooling system for an active cooling of the absorption body, whereby the cooling system comprises at least one cooling duct within the absorption body for a flow of coolant, preferably water, through the absorption body. The cooling duct of the cooling system runs through the absorption body and allows a flow of coolant through the absorption body. The coolant can be a fluid, preferably water is used as coolant. By flowing through the absorption body, the coolant cools the absorption body. Preferably, the cooling system maintains the absorption body at a constant temperature. Hence, the absorption body does not change its temperature and hence maintains its detection capability for the impinging electromagnetic radiation. Further, the coolant flowing through the cooling duct in the absorption body preferably absorbs any energy deposited into the absorption body by the impinging electromagnetic radiation. Thereby the temperature of the coolant changes according to the amount of absorbed energy.

Accordingly, the detector according to the present invention can be further improved by that the heat sensing element comprises flow sensors to measure the flow of the coolant through the cooling ducts in the absorption body and temperature sensors to measure an absolute temperature of the coolant and/or a temperature change of the coolant induced by flowing through the cooling ducts in the absorption body. For measuring the temperature and/or a change in temperature of the coolant, and thereby of the absorption body, the sensing element of the detector according to the present invention comprises two different types of sensors, namely flow sensors and temperature sensors. In particular, the flow sensors measure the flow rate of coolant flowing through the cooling duct. The temperature sensors measure the temperature of the coolant. In particular, the temperature of the coolant is measured at least at an outlet of the cooling duct, preferably also at an inlet of the cooling duct. The outlet temperature allows to detect a temperature change over time, presupposed that the coolant is provided at the inlet with constant temperature. By additionally measuring the inlet temperature of the coolant, this measurement of relative temperature changes can be improved. Especially, by combining the temperature measurements with the aforementioned flow measurement, an absolute value of an energy deposit caused by absorbed electromagnetic radiation into the absorption body can be determined.

This additionally measured temperature value can be used to check the measurement of the temperature sensor arranged in the bore and/or to enhance the overall accuracy of the temperature measurement. In addition, if the temperature measurement based on the temperature sensor in the bore fails or is completely missing, a measurement of the temperature of the absorption body and hence of the energy deposited into the absorption body by the electromagnetic radiation is still possible.

Further, the detector according to the present invention can preferably comprise that the absorption body comprises, in particular consists of, metal, in particular copper or aluminum. Metal as material for the absorption body provides several advantages. First of all, metals, in particular copper and aluminum, comprise high heat conduction. The detector according to the present invention is designed as a bolometer, which absorbs the impinging electromagnetic radiation and comprises sensor elements to measure a temperature and/or a temperature change caused by this absorption. Materials with high heat conduction are especially suitable for such bolometers. Further, metals are materials compatible for a usage under ultrahigh vacuum conditions. A contamination of such an ultrahigh vacuum as reaction atmosphere by the detector according to the present invention and vice versa can therefore be avoided.

According to a further preferred embodiment of the detector according to the present invention, the absorption body encloses at one end a hollow absorption volume, whereby the inner sidewalls of the absorption volume form the absorption surface and wherein the absorption volume comprises an absorption orifice, whereby the absorption orifice can be aligned to an assumed and/or determined impinging direction of the electromagnetic radiation to be measured. As mentioned above, in most of the cases also the absorption surface absorbs only a fraction of the impinging electromagnetic radiation, at least of the electromagnetic radiation directly impinging on the detector. In this preferred embodiment of the detector according to the present invention, the absorption surface is provided as inner sidewalls of a hollow absorption volume. The electromagnetic radiation impinging on the detector enters the absorption volume through an absorption orifice. Within the absorption volume, the electromagnetic radiation impinges on the absorption surface and is partly absorbed and partly reflected. As this reflection occurs within the absorption volume, which is preferably large with respect to the absorption orifice, there is a high probability that the reflected electromagnetic radiation misses the absorption orifice and hits again an inner sidewall of the absorption volume, in other words another section of the absorption surface. In an ideal case, this procedure repeats itself until the impinging electromagnetic radiation is completely or at least essentially completely absorbed by the absorption body. In this case, the energy deposit into the absorption body represents the total energy of the impinging electromagnetic radiation. Especially any coating of the absorption surface with evaporated source material is thereby rendered without effect.

A further improved embodiment of the detector according to the present invention can comprise that the absorption surface is partly conically shaped within the absorption volume, with a cone of the conically shaped absorption surface facing the absorption orifice. The cone can be shaped both as a protrusion and as a recess, respectively, whereby in the protrusion embodiment a tip of the cone faces the absorption orifice, and in the recess embodiment a base of the cone faces the absorption orifice. In other words, the impinging electromagnetic radiation traversing the absorption orifice hits first the conically shaped part of the absorption surface. As the cone faces the absorption orifice, any electromagnetic radiation reflected on the sides of the cone are directed somewhere into the absorption volume and definitely miss the absorption orifice. Hence the above described ideal case of a complete absorption of the impinging electromagnetic radiation in the absorption volume can be reached more easily.

In addition, the detector according to the present invention can be improved by that the part of the absorption volume forming a rim of the absorption orifice is tilted inward with respect to the absorption volume. Similar to the aforementioned cone opposite to the absorption orifice, also an inwardly tilted rim around the absorption orifice helps ensuring a reflection of electromagnetic radiation back into the absorption volume. Hence also in this embodiment of the detector according to the present invention, the above described ideal case of a complete absorption of the impinging electromagnetic radiation in the absorption volume can thereby be reached more easily.

Preferably, the detector according to the present invention comprises both, a conically shaped section opposite to the absorption orifice and a tilted rim surrounding the absorption orifice.

Another embodiment of the detector according to the present invention can be characterized in that the detector comprises an aperture with an aperture opening, wherein the aperture is arranged upstream with respect to the sensor element along the assumed and/or determined impinging direction of the electromagnetic radiation to be measured. Such an aperture can help defining the solid angle which can be surveyed by the detector according to the present invention. To enhance the definition of the solid angle, also two or more apertures can be used, respectively aligned and stacked upstream along the assumed and/or determined impinging direction. Preferably, the aperture is sized and arranged such that, for instance, a source surface illuminated by the electromagnetic radiation source is visible from the point of view of the detector and hence electromagnetic radiation reflected on the source surface can reach the detector. In addition, electromagnetic radiation originating from other locations within the vacuum chamber is stopped by the aperture and therefore the overall accuracy of the measurement of the detector according to the present invention can be improved.

According to a further improved embodiment of the detector according to the present invention, a size of the aperture opening is adapted to the absorption body, in particular to the absorption orifice, such that electromagnetic radiation coming through the aperture opening is impinging on the absorption surface, in particular through the absorption orifice, of the absorption body. In this embodiment, the aforementioned restriction of the field of view of the detector is improved further.

As the aperture opening and the absorption body, especially the absorption orifice, are constructed adapted to each other, it can be ensured that all of the electromagnetic radiation coming through the aperture orifice can be registered by the detector. A loss of information can thereby be avoided or at least be minimized.

To further restrict and optimize the field of view, multiple successive apertures may be used. This is particularly useful for intense sources located close together that need to be measured at a large distance from the source.

In addition, the detector according to the present invention can be improved by that the detector comprises a shielding element, wherein the shielding element extends along the assumed impinging direction of the electromagnetic radiation to be measured between the aperture and the absorption body. Together with the aperture, the shielding element forms a volume in front of the detector only accessible for electromagnetic radiation coming through the aperture orifice. Scattered electromagnetic radiation, which completely misses the aperture and nevertheless would impinge on the absorption body, is stopped by the shielding element. The field of view of the detector can thereby be defined with improved precision.

Further, in another improved embodiment of the detector according to the present invention, the shielding element extends further along the assumed impinging direction of the electromagnetic radiation along the absorption body. Electromagnetic radiation impinging on the absorption body away from the absorption surface can nevertheless deposit energy into the absorption body and thereby distort the results measured by the detector. A shielding element further extending along the absorption body covers the absorption body and intercepts all incoming electromagnetic radiation. A distortion of the measurement of the detector can therefore be avoided or at least be minimized.

In another preferred embodiment, the detector according to the present invention can be characterized in that the detector comprises two or more sensor elements, whereby the two or more sensor elements are adjacent to each other and thermally decoupled. As already mentioned above, during the evaporation, the source surface may change its spatial shape, especially the source surface can establish a convex or concave shape. This spatial shape of the source surface also influences the measurement results of the detector, as part of the reflected electromagnetic radiation simply misses the main detector and/or other parts are even focused on the direction of the detector. By providing a detector with two or more sensor elements, a more precise measurement of the distribution of the reflected electromagnetic radiation can be obtained. In particular, even changes in the spatial shape and/or form of the source surface can be detected, as these changes result in detectable differences in the distribution of the reflected electromagnetic radiation measured by the two or more sensor elements. By providing these two or more sensor elements thermally decoupled, an independent measurement of each sensor element can be provided. The arrangement of the sensor elements adjacent to each other ensures that gaps between the sensor elements, in which the reflected electromagnetic radiation eludes the detector, are minimized.

In addition, the detector according to the present invention can be improved by that the two or more sensor elements are arranged in a rotationally symmetric pattern or in rows or in a matrix in a plane perpendicular or at least essentially perpendicular to the assumed and/or determined impinging direction of the electromagnetic radiation to be measured. The different patterns allow an adaption of the detector to different measurement purposes. For instance, a rotationally symmetric pattern allows identifying focusing issues on the electromagnetic radiation provided by the electromagnetic radiation source, whereby an arrangement in rows is especially useful to spot misalignments between this electromagnetic radiation and the source surface. A matrix, especially when a plurality of sensor elements is used, allows an even more detailed measurement of the distribution of the electromagnetic radiation reflected on the source surface.

A further improved embodiment of the detector according to the present invention can comprise that in a plane perpendicular or at least essentially perpendicular to the assumed and/or determined impinging direction of the electromagnetic radiation to be measured, the two or more sensor elements comprise one of the following shapes:

rectangle
square
circle
circular ring
circular ring segment

This list is not complete and can be expanded by further suitable shapes. In particular with the above mentioned arrangement patterns of the two or more sensor elements, a shape of the respective sensor element adaptedly chosen to the applied present pattern allows a compact and continuous arrangement of the respective sensor elements, without avoidable gaps between the separate sensor elements.

Further, the detector according to the present invention can be characterized in that the detector comprises arrangement elements for arranging the absorption body at a vacuum feedthrough. This especially preferred embodiment of the detector according to the present invention allows arranging the detector directly in and/or at a vacuum feedthrough of the vacuum chamber. All connections, for instance the inlet and outlet port of the coolant channel and the electric connection of the sensor elements, are accessible from outside of the vacuum chamber. Within the vacuum chamber, essentially only the absorption body is located, if present also the aperture and/or the shielding element. These elements can be provided in embodiments capable for ultrahigh vacuum. A mutual impairment of parts of the detector and the reaction atmosphere within the vacuum chamber can therefore be avoided.

According to a further improved embodiment of the detector according to the present invention, the arrangement elements comprise positioning elements for altering a position of the absorption body with respect to the vacuum feedthrough. The possibility to alter the position of the absorption body within the vacuum chamber can be used for instance to exchange the source material and/or the target material. Interfering of such exchanging procedures by the detector, in particular by the absorption body, can thereby be avoided. In particular, after a completion to the procedure, the absorption body can be rearranged near to the source element to enhance the measurement capability of the detector according to the present invention by enlarging the covered solid angle.

According to a third aspect of the invention, the object is satisfied by a system for thermal evaporation with electromagnetic radiation, comprising an electromagnetic radiation source for providing an electromagnetic radiation, a vacuum chamber containing a reaction atmosphere and a main detector for measuring electromagnetic radiation, wherein a source material and a target material to be coated are arranged in the vacuum chamber and the electromagnetic radiation source is arranged such that its electromagnetic radiation impinges at an angle, preferably at an angle of 45°, on the source surface of the source material for a thermal evaporation and/or sublimation of the source material below the plasma threshold, wherein the main detector for measuring electromagnetic radiation is arranged such that electromagnetic radiation reflected on the source surface reaches the main detector, wherein the system according to the third aspect of the present invention is adapted to carry out a method according the first aspect of the present invention. Hence all features and advantages described in detail with respect to a method according to the first aspect of the present invention can also be provided by a system according to the third aspect of the present invention which is adapted to carry out the method according to the first aspect of the present invention.

Preferably, the system according to the present invention can be improved by that at least the main detector, preferably every detector for electromagnetic radiation, is constructed according to the second aspect of the invention. In this special embodiment, all features and advantages described in detail with respect to a detector according to the second aspect of the present invention can also be provided by a system according to the third aspect of the present invention which comprises at least one detector according to the second aspect of the present invention.

Figure 2:
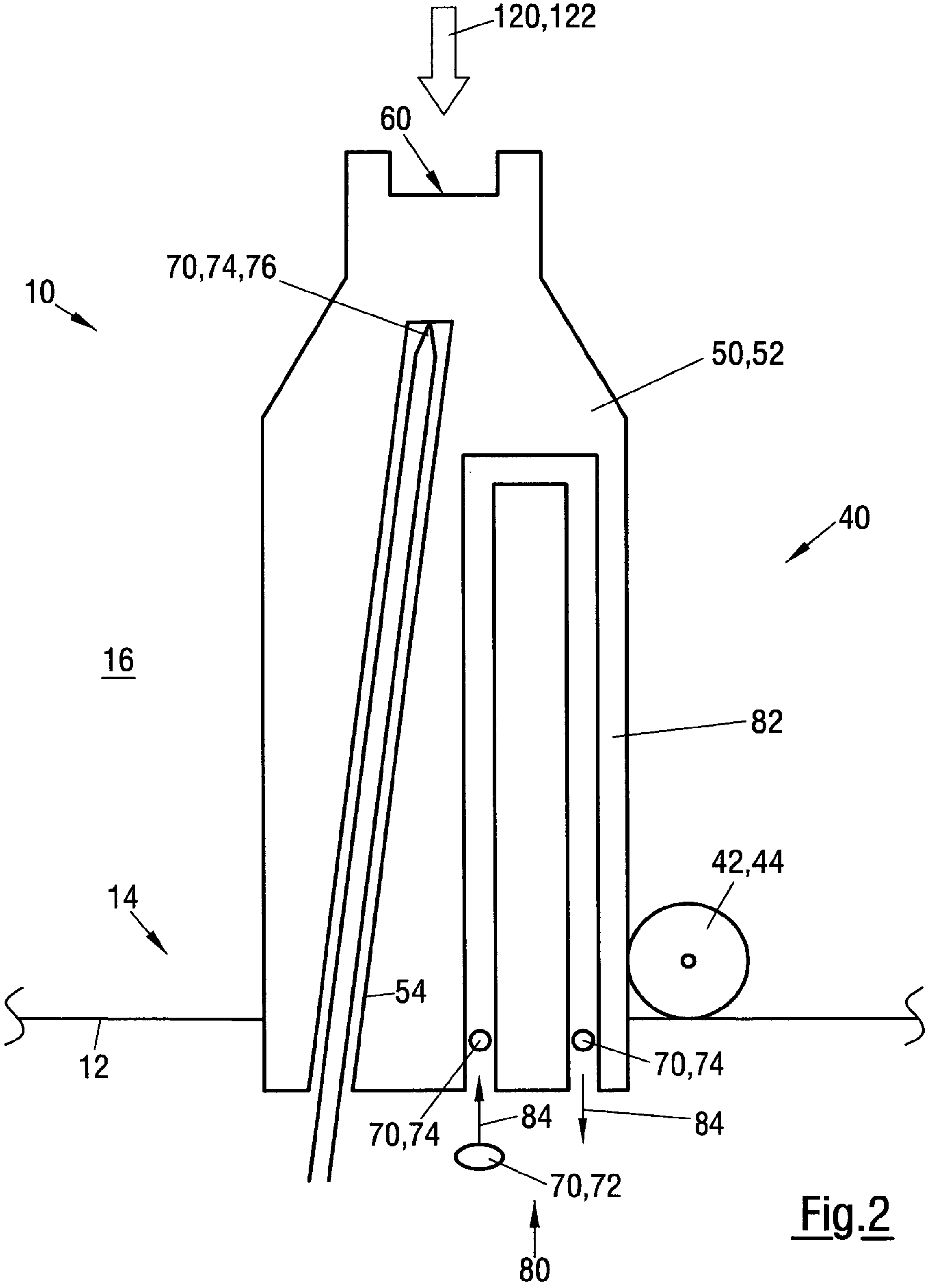
Figure 3:
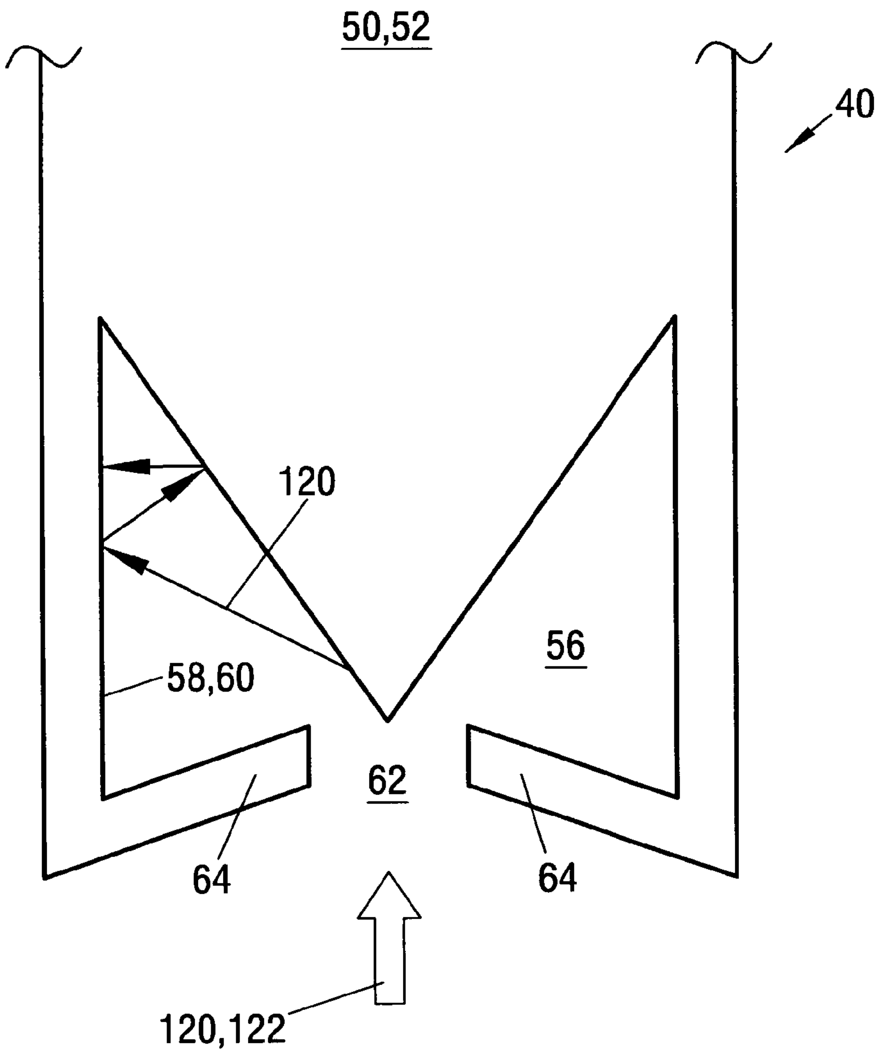
Figure 4:
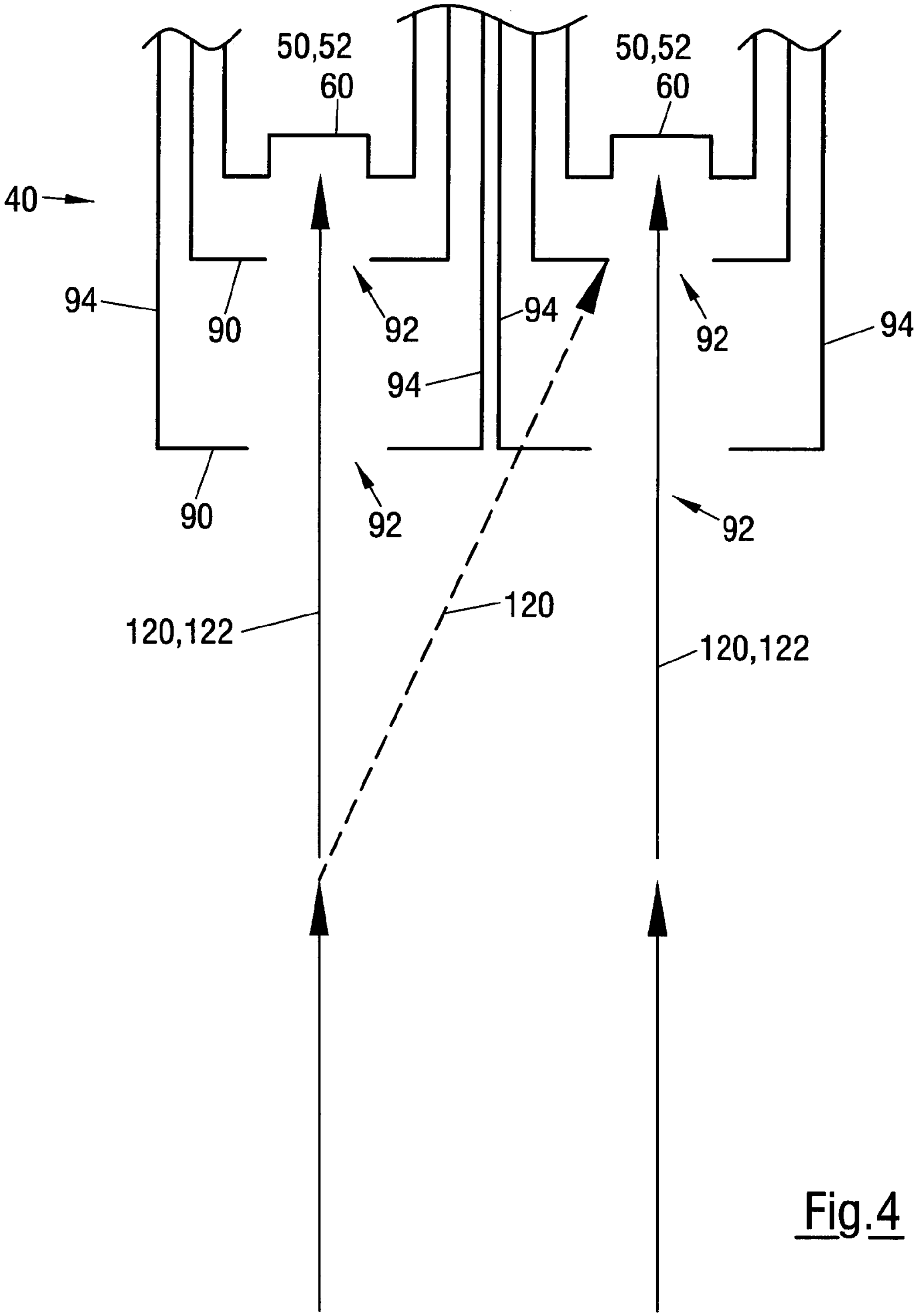
Figure 5:
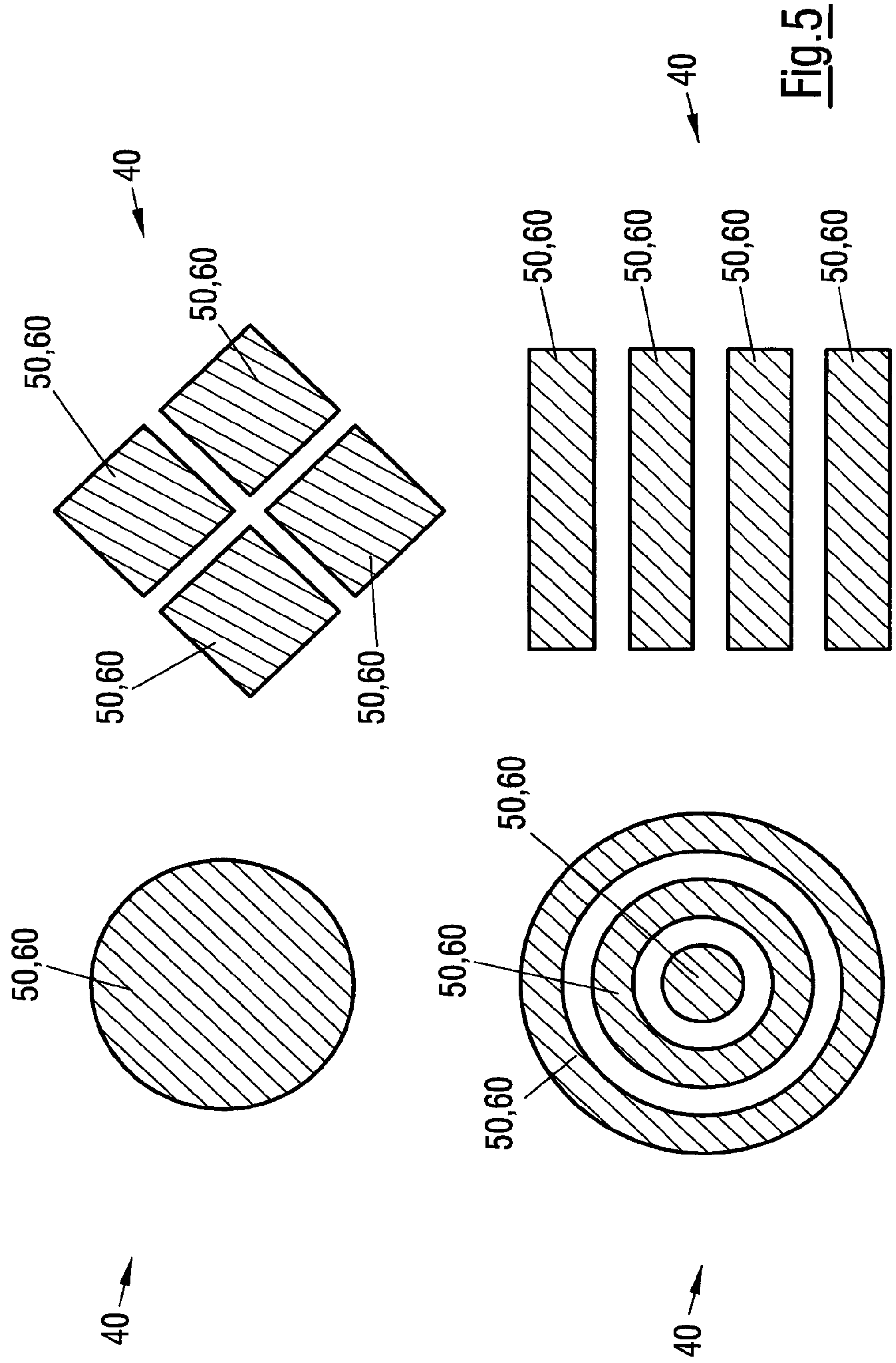
Figure 8:
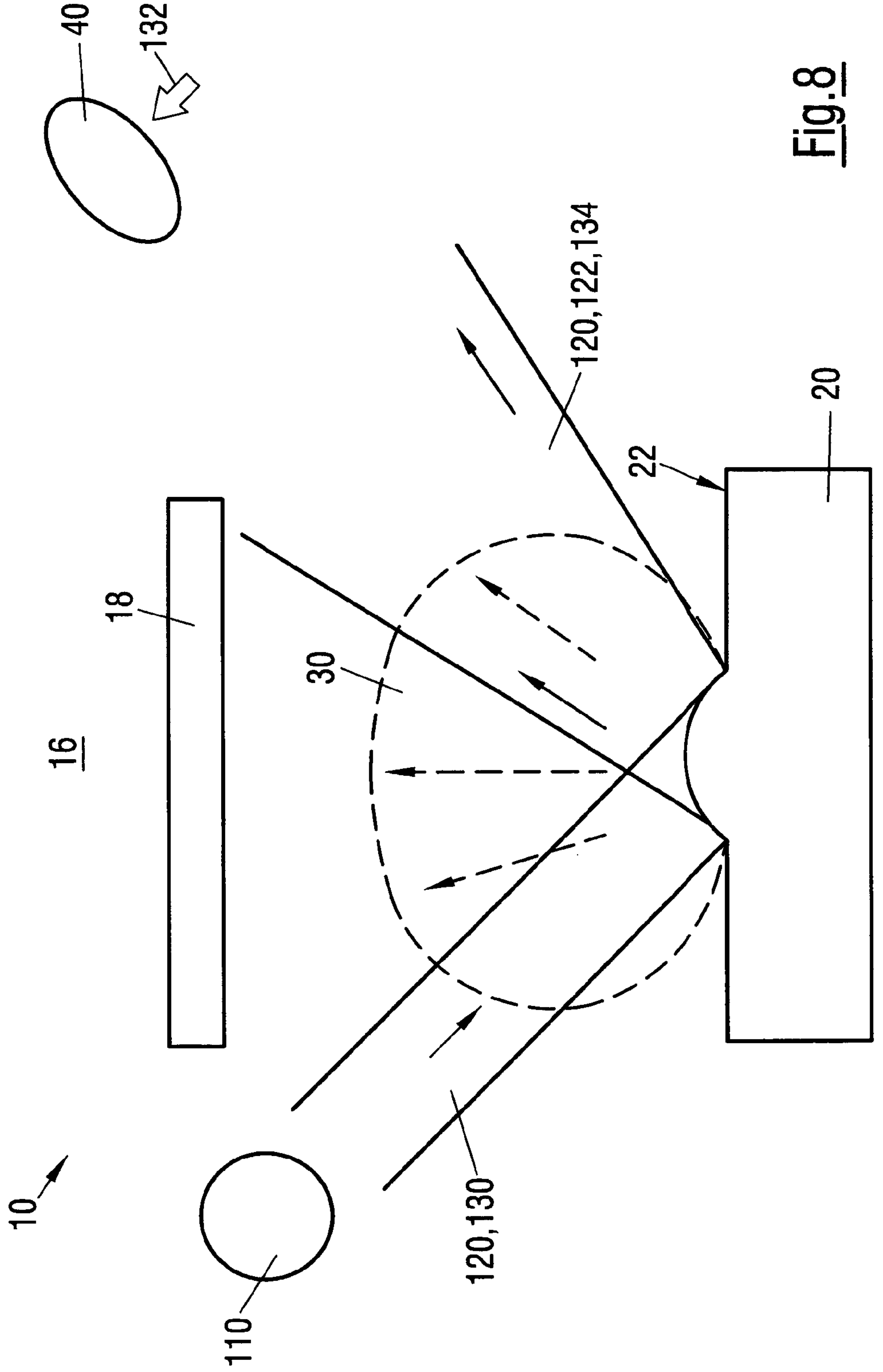
Figure 9:
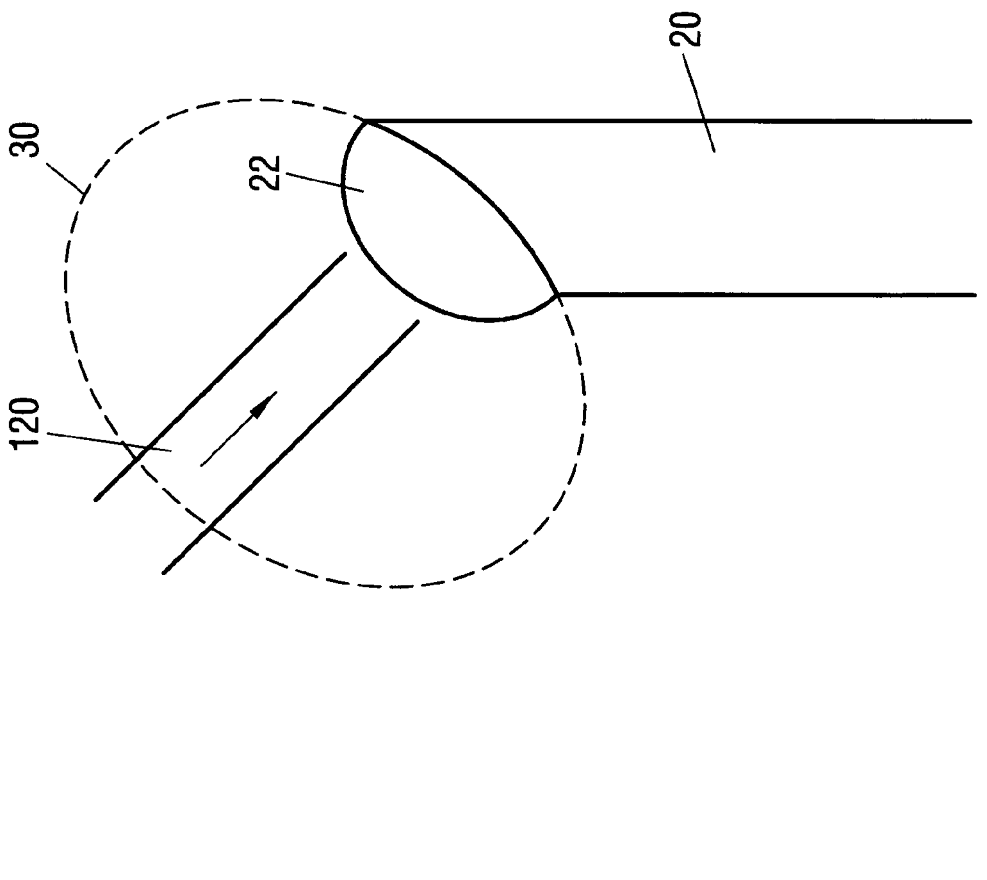
Figure 10:
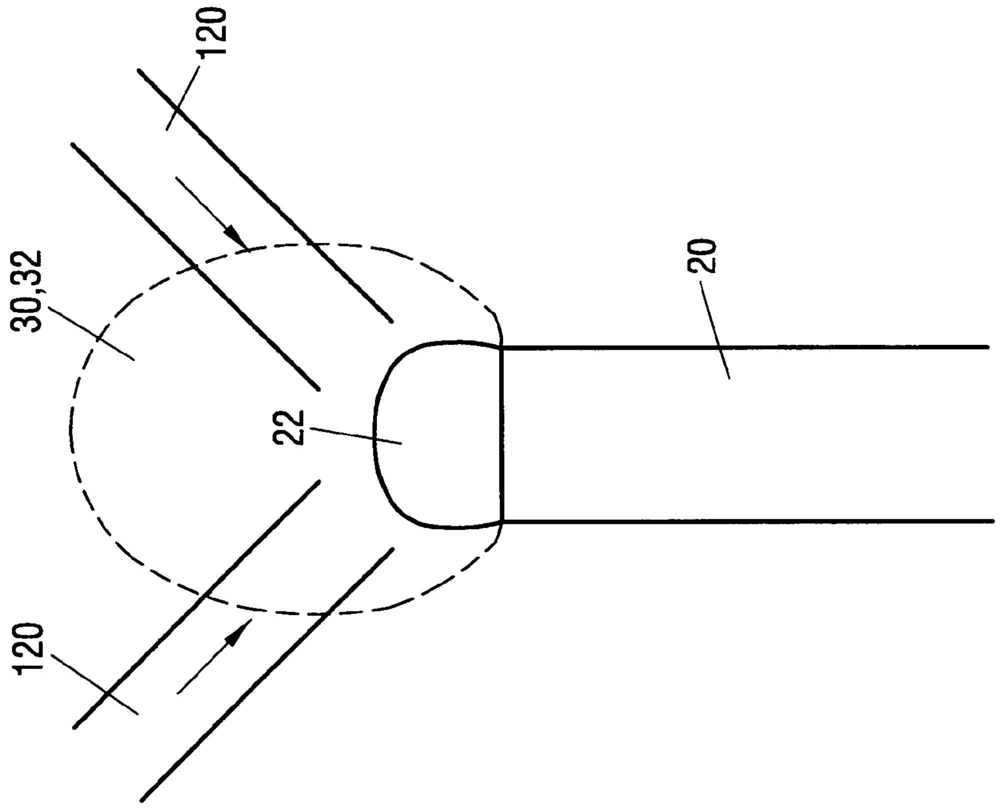
Figure 11:
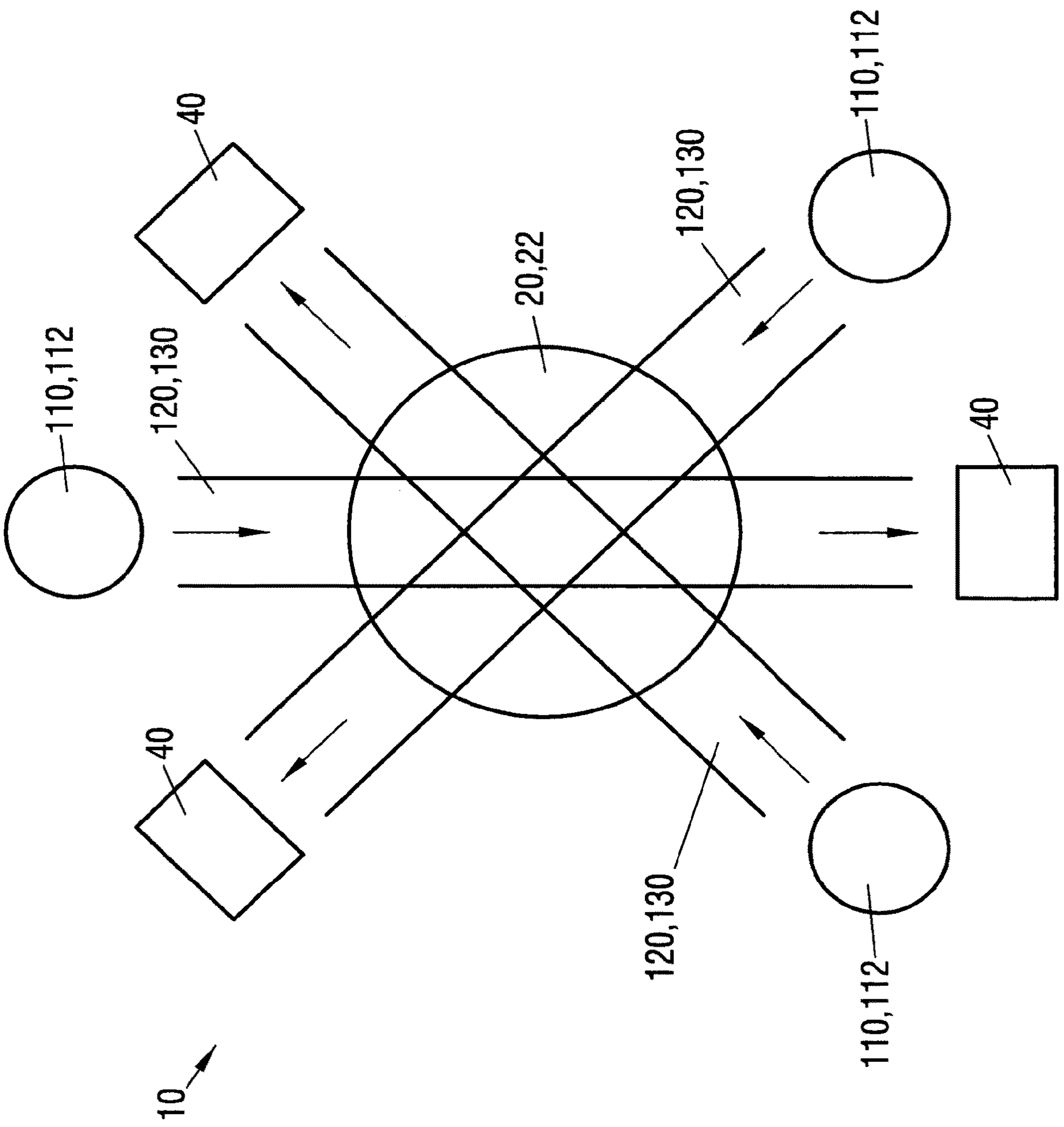
Figure 12:
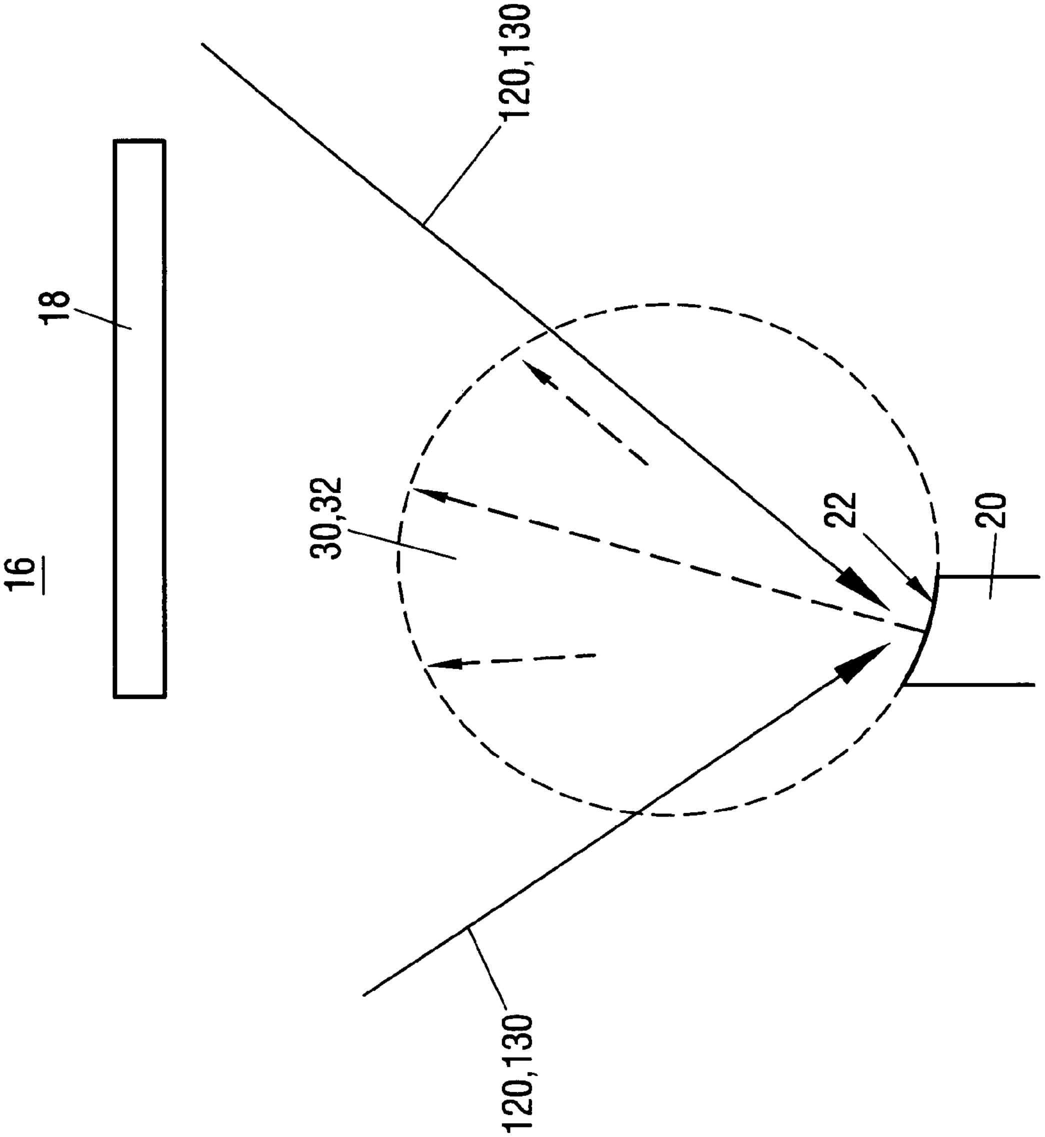

The present invention is further described hereinafter with reference to illustrated embodiments shown in the accompanying drawings. There is shown:

FIG. 1A system according to the present invention,

FIG. 2A first possible embodiment of the detector according to the present invention, FIG. 3 An absorption body with an absorption volume, FIG. 4 An embodiment of the detector according to the present invention with two sensor elements, FIG. 5 Arrangement patterns of sensor elements, FIG. 6A flux of evaporated source material from a flat source surface, FIG. 7A flux of evaporated source material from a concave source surface, FIG. 8A flux of evaporated source material from a convex source surface, FIG. 9 Tilting of a melted drop of source material, FIG. 10 Behavior of the melted drop with two impinging electromagnetic radiations, FIG. 11 Possible arrangement of three radiation emitters, and FIG. 12 Sweeping of the target by adjusting two beams of impinging electromagnetic radiation.

In FIG. 1, the main components of a system 10 for thermal evaporation of source material 20 with electromagnetic radiation 120 according to the present invention are shown. The source material 20 is arranged within a vacuum chamber 12, whereby the vacuum chamber 12 confines a reaction atmosphere 16. The vacuum chamber 12 itself is only indicated next to a vacuum feedthrough 14. At one of the vacuum feedthroughs 14 an electromagnetic radiation source 110 is arranged, at the other a detector 40 according to the present invention.

During operation of the system 10, the electromagnetic radiation source 110 provides electromagnetic radiation 120 directed and impinging on the source surface 22 of the source material 20. The source material 20 absorbs a fraction of the electromagnetic radiation 120 and therefore some of the source material 20 evaporates or sublimates, indicated in FIG. 1 by the dashed circular line. Opposite to the source material 20, a target material 18 is arranged. The evaporated source material 20 reaches the target material 18 and forms a coating on the surface of the target material 18.

The remaining fraction of the electromagnetic radiation 120 is reflected on the source surface 20. As the emitting direction of the electromagnetic radiation source 110 and the position and general orientation of the source surface 22 are known, it is possible to arrange a detector 40 in the assumed and/or determined impinging direction 122 of the reflected electromagnetic radiation 120. As already described for the electromagnetic radiation source 110, also the detector, in particular its absorption body 52, can be arranged at a vacuum feedthrough 14 of the vacuum chamber 12.

The detector 40 according to the present invention acts as a bolometer. The electromagnetic radiation 120 impinges onto the absorption surface 60 of the absorption body 52 and gets absorbed at least partly. As depicted, the absorption surface 60 faces the source surface 22 and hence also gets coated by evaporated source material 20, indicated in FIG. 1. Hence, after a short build up time, the absorption surface 60 comprises the same or at least similar absorption and reflection properties as the source surface 22.

The aforementioned energy deposit into the absorption body 52 causes a change in temperature of the absorption body 52 or at least a rise of a demand for cooling. By measuring the temperature or its changing behavior, an evaporation rate and/or a flux distribution of the source material 20 evaporated or sublimated by the impinging electromagnetic radiation 120 can be determined.

FIG. 2 depicts a cross-section of a possible embodiment of detector 40 according to the present invention. The detector 40 comprises a single sensor element 50 with an absorption body 52, preferably consisting of a metal with high thermal conduction like copper or aluminum. An arrangement element 40 allows arranging the absorption body 52 at a vacuum feedthrough 14 of the vacuum chamber 12 of the system 10 according to the present invention. In particular, the arrangement element 42 comprises positioning elements 44 to alter the actual position of the absorption body 52 within reaction atmosphere 16 of the vacuum chamber 12. A movement of other elements of the system 10 arranged in the vacuum chamber 12 as for instance the source material 20, see FIG. 1, can therefore be provided without any hindrance caused by the detector 40.

The detector 40 according to the present invention is based on the principle of a bolometer. Electromagnetic radiation 120 impinges onto an absorption surface 60 of the absorption body 52 and gets absorbed at least partially. This energy deposit can be measured by measuring the absolute temperature or a change of the temperature of the absorption body 52.

For this, in the depicted detector 40 according to the present invention two different measurement methods and respective sensing elements 70 are implemented. The respective methods can be used separately to measure the temperature or its change. However, higher accuracy can be provided by combining the two methods described in the following.

For the first method, a temperature sensor 74, preferably a thermocouple element 76, is arranged in a bore 54 of the absorption body 52, in particular in the vicinity of the absorption surface 60. As mentioned above, the energy deposited by the electromagnetic radiation 120 impinging on the absorption surface 60 causes a rise in temperature of the absorption body 52. The thermocouple 76 located within the absorption body 52 near to the absorption surface 60 can measure this as absolute temperature or as a change in temperature. Hence, also this measurement method allows to precisely determine the amount of energy deposited into the absorption body 52.

For the second method, the absorption body 52 comprises a cooling system 80 for an active cooling. Coolant 84 flows through a cooling duct 82 through the absorption body 52 and thereby assimilates the energy deposited into the absorption body 80 by the impinging electromagnetic radiation 120. Flow sensors 72 measure the flow rate of the coolant 84, temperature sensors 74 measure the temperature of the coolant 84, as depicted in FIG. 2 both at the inlet port and at the outlet port of the cooling duct 82, respectively. In summary, these measurements combined allow to precisely determine the amount of energy deposited into the absorption body 52.

FIG. 3 shows a cross-section of a rotationally symmetrical preferred embodiment of the detector 40 according to the present invention, in particular of its absorption surface 60. According to this embodiment, the absorption body 52 of the depicted sensor element 50 comprises at its end, which faces the impinging direction 122 of the electromagnetic radiation 120 to be measured, a hollow absorption volume 56. This absorption volume 56 comprises a single opening, namely an absorption orifice 62, which allows the impinging electromagnetic radiation 120 to enter the absorption volume 56. Inner sidewalls 58 of the absorption volume 56 form the absorption surface 60. In other words, the electromagnetic radiation 120 enters the absorption volume 120 and is reflected many times within the absorption volume 56, indicated in FIG. 3 by arrows, whereby at each reflection a fraction of the energy of the impinging electromagnetic radiation 120 is absorbed. Ideally, the electromagnetic radiation 120 is trapped in the absorption volume 56 and consequently completely absorbed by the absorption surface 60. To enhance a probability for this ideal case, the part of the sidewall which forms a rim 64 surrounding the absorption orifice 62 is tilted inward with respect to the absorption volume 56. This inwardly tilted surface provides the additional advantage that a reflection of electromagnetic radiation impinging on these surfaces back into the impinging direction can be avoided. In addition, the part of the absorption surface 60 arranged opposite of the absorption orifice 62 is conically shaped with the cone tip pointing towards the absorption orifice 62.

In FIG. 4 a detector 40 with two sensor elements 50 is shown. The sensor elements 50 are arranged adjacent to each other and thermally decoupled. Each sensor element 50 comprises its own absorption body 52 and absorption surface 60.

The remaining parts of the sensor elements 50 are not shown. In summary, providing two or more sensor elements

50 can provide a more detailed information about the absorbed electromagnetic radiation 120, for instance for a determination of an evaporation rate and/or of a distribution of a flux of the evaporated source material 20 (not shown).

In addition, upstream of the each of the respective sensor elements 50, two stacked and aligned apertures 90 are arranged. The aperture openings 92 confine the solid angle of acceptance of the respective sensor element 50. Cross talk between the sensor elements 50, indicated by the dashed arrow, can be avoided. Further, between the apertures 90 and the absorption body 52, and even further along the respective aperture body 52, shielding elements 94 are arranged. These shielding elements 94 on one hand further diminish the aforementioned crosstalk. On the other hand, also electromagnetic radiation 120 impinging on a side surface of the absorption body 52 is stopped and cannot distort the measurement results.

As mentioned with respect to FIG. 4, the detector 40 according to the present invention can comprise two or more sensor elements 50. A few examples for shapes and arrangement patterns of sensor elements 50 and their absorption surfaces 60 are shown in FIG. 5. Obviously, other arrangements, in one limit a high-resolution pixel array similar to an electronic camera, are possible. In summary, out of the different arrangement patterns the most suitable can be chosen with respect to the purpose of the measurement of the detector 40, for instance a determination of an evaporation rate and/or of a distribution of a flux of the evaporated source material 20.

The standard geometry with a simple circular active area is shown in the top left panel of FIG. 5.

A movement of the impinging direction 122 of the electromagnetic radiation 120 can be detected with four quadrants as shown in the top right panel. Here, the sensor elements 50 are shaped as squares and are arranged such that primarily movements in the horizontal and vertical directions along their diagonals can be detected, while keeping the number of sensor elements 50 small.

The third arrangement with sensor elements 50 forming a rotationally symmetric pattern of circular rings is shown in the lower left panel of FIG. 5. This pattern is most sensitive to focusing or defocusing of the electromagnetic radiation 120 provided by the electromagnetic radiation source 110.

Both position and defocusing, although in this case only in the vertical direction, may be detected by a stripe arrangement of rectangular shaped sensor elements 50, such as shown in the lower right panel of FIG. 5. This can be favorable, as the electromagnetic radiation 120, being reflected in the impinging direction 122 around 45° on the source surface 22, is more strongly affected in the plane containing the incident and reflected beam, than perpendicular to it.

Figure 6:
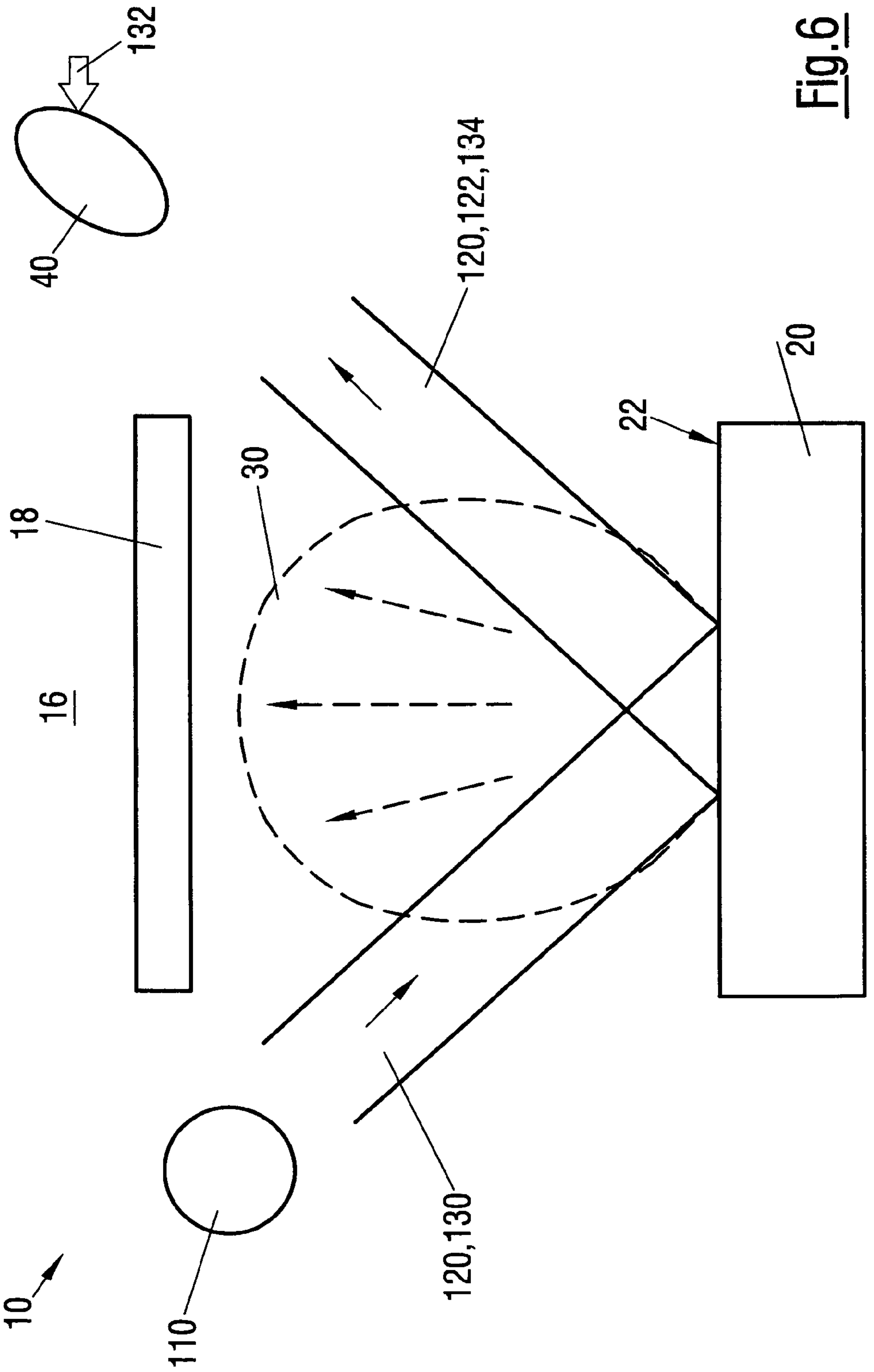
Figure 7:
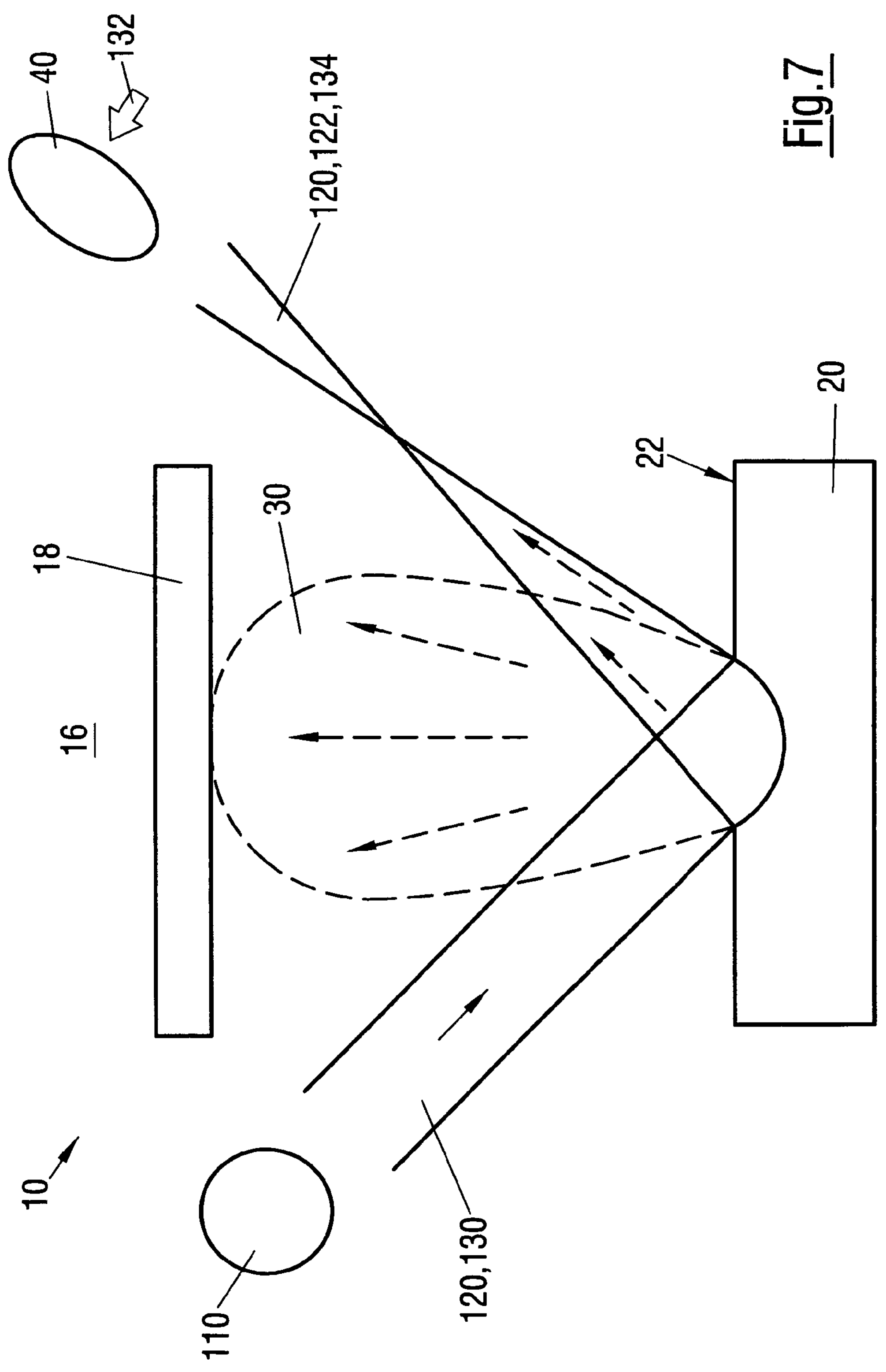

The following three figures FIGS. 6, 7 and 8 show the influence of the shape and form or the source surface 22 of the source material on both the flux distribution 30 of the evaporated source material 20 and the distribution of the electromagnetic radiation 120 reflected on the source surface 22 into measured distribution 134 on the detector 40. In the following, the figures FIGS. 6, 7 and 8 are described together, whereby the differences of the figures are highlighted. Additionally, the method according to the present invention will be described.

The electromagnetic radiation source 110 provides electromagnetic radiation 120 with an impinging distribution 130. This provision of the electromagnetic radiation 120 is done in step c) of the method according to the present invention. According to step a), the impinging distribution 130 is defined such that the flux distribution 30 of the source material 20 evaporated from the source surface 22 correspond to the also in step a) defined desired distribution 32 of the evaporated and/or sublimated source material 20. Especially in the situation shown in FIG. 6 with a flat source surface 22, this condition can be met easily. The target material 18, arranged in the reaction atmosphere 16 opposite to the source material 20, can be coated with the evaporated source material 20 as expected.

For allowing a control of this coating process, a detector 40 is arranged such that electromagnetic radiation 120 reflected on the source surface 22 in the impinging direction 122 can be measured, in particular in step d) of the method according to the present invention. As result, the detector 40, preferably with considering a response function of the detector 40, provides a measured distribution 134 of the measured electromagnetic radiation 120. As any changes in form and/or shape of the source surface 22 will imprint themselves onto the reflected electromagnetic radiation 120, this measured distribution 134 can be used to detect any deviations from the assumed ideal case.

For this, in the second step b) of the method according to the present invention an expected distribution 132 of the reflected electromagnetic radiation 120 is determined, for instance calculated, empirically estimated or experimentally determined. By comparing the measured distribution 134 of the electromagnetic radiation 120 reflected on the source surface 22 with the expected distribution 132 in step f) of the method according to the present invention, differences of these two distributions 132, 134 can be determined.

Based on the differences found in step f) of the method according to the present invention, step g) includes a redetermination of the impinging distribution 130 for eliminating these differences. Finally, in the last step h) the electromagnetic radiation source 110 provides electromagnetic radiation 120, for instance laser light with a wavelength between 100 nm and 1400 nm, with newly redetermined impinging distribution 130. An actual control of the flux distribution 30 of the evaporated source material 20 can thereby be provided.

In particular, at least the steps d) to h) of the method according to the present invention can be repeatedly carried out to provide an active closed loop control of the evaporation. Alternatively or additionally, in step a) the desired distribution 32 already can be defined with a time dependency.

As already mentioned above, in FIG. 6 a source material 20 with a flat source surface 22 is shown. This is an ideal case and easily to calculate. The actual flux distribution 30 equals the desired distribution 32.

After some irradiation by the electromagnetic radiation 120, the source surface 22 may develop a concave section, for instance due to the actual evaporation of source material 20. By this, both the flux distribution 30 and the distribution of the reflected electromagnetic radiation, respectively, change. The flux distribution 30 no longer equals the desired distribution 32 (not shown). By comparing the newly measured distribution 134 with the expected distribution 132, this situation can be identified and solved by accordingly redetermining the impinging distribution 130.

FIG. 8 shows an analogue situation to FIG. 7. The only difference is the shape of the source surface 22, which is not concave but convex. All descriptions with respect to the distributions 30, 130, 132, 143 and the above presented solution approach are the same as described with respect to FIG. 7 and hereby referred to.

In FIG. 9 a special behavior of some source materials 20 is shown. The depicted source material 20 is provided as self-supporting rod, whereby the source surface 22 is arranged at the upper end of the rod. By illuminating the source surface 22 with impinging electromagnetic radiation 120, a drop of melted source material 20 establishes at this upper end of the rod consisting of source material 20. As the electromagnetic radiation 120 impinges at an angle, for instance at 45°, the side of the rod nearer to the electromagnetic radiation 120 absorbs more energy. Hence as a result, the drop of melted source material 20 leans and/or tilts into the direction of the electromagnetic radiation 120. In particular, also the flux distribution 30 follows this spatial orientation.

FIG. 10 shows a possible solution for this problem. According to the method according to the present invention, a second beam of electromagnetic radiation 120 can be used to balance the energy deposit into the source material 20. The flux distribution 30 is no longer distorted and again equals the desired distribution 32.

The number of beams of electromagnetic radiation 120 is not limited to two. FIG. 11 shows an embodiment of a system 10 according to the present invention with an electromagnetic radiation source 110 comprising three emitter sections 112. The emitter sections 112 are arranged rotationally symmetric around the source surface 22 on the source material 20. For each beam of electromagnetic radiation 120, a dedicated detector 40 is provided. Hence the method according to the present invention described above can be carried out with each pair of emitter section 112 and detector 40 both individually and combined, respectively. In particular, the emitter sections 112 can provide electromagnetic radiation 120 with adjustable power densities and/or shapes and/or sizes. Hence, the actual impinging distribution 130, and therefore also the flux distribution 30 and the desired distribution 32, can provide even a spatial variation at the source surface 22.

This situation is depicted in FIG. 12. Two impinging beams of electromagnetic radiation 120 are shown, whereby their impinging distributions 130 differ, as hinted by the different thickness of the depicted arrows. This difference, for instance provided by different power densities of the provided beams of electromagnetic radiation 120, results in a slightly distorted flux 30 of the source material 20 evaporated from the source surface 22. In this case, this is intentional and the flux distribution 30 equals the desired distribution 32. It is clearly visible, that the target material 18 will not be coated equally by this flux distribution 30, as the flux distribution 30 is directed to one side of the target material 18. By varying the individual impinging distributions 130 of the beams of electromagnetic radiations 120, the direction of the flux distribution 30 can be altered. As result, a desired deposition thickness or thickness variation, or a time dependent sweep of the desired distribution 32 over the target material 18 can be realized and tracked by the actual flux distribution 30.

LIST OF REFERENCES

10 System
12 Vacuum chamber
14 Vacuum feedthrough
16 Reaction atmosphere
18 Target Material
20 Source material
22 Source surface
30 Flux distribution
32 Desired distribution
40 Detector
42 Arrangement element
44 Positioning element
50 Sensor element
52 Absorption body
54 Bore
56 Absorption volume
58 Sidewall
60 Absorption surface
62 Absorption orifice
64 Rim
70 Heat sensing element
72 Flow sensor
74 Temperature sensor
76 Thermocouple element
80 Cooling system
82 Cooling duct
84 Coolant
90 Aperture
92 Aperture opening
94 Shielding element
110 Electromagnetic radiation source
112 Emitter section
120 Electromagnetic radiation
122 Impinging direction
130 Impinging distribution
132 Expected distribution
134 Measured distribution

What is claimed is:

1. Method for controlling a flux distribution of evaporated source material in a system for thermal evaporation with electromagnetic radiation, wherein the system comprises an electromagnetic radiation source for providing an electromagnetic radiation, a vacuum chamber containing a reaction atmosphere and a detector for measuring electromagnetic radiation, wherein a source material and a target material to be coated are arranged in the vacuum chamber and the radiation source is arranged such that its electromagnetic radiation impinges at an angle on a source surface of the source material for a thermal evaporation and/or sublimation of the source material, whereby an energy deposit of the electromagnetic radiation evaporates or sublimates the source material and the energy deposit is chosen such that plasma threshold of the source material is not reached, wherein a fraction of the electromagnetic radiation impinging on the source surface is absorbed by the source material and used for the evaporation process below the plasma threshold, and a remaining part of the electromagnetic radiation is reflected on the source surface, and wherein the detector for measuring electromagnetic radiation is arranged such that said electromagnetic radiation reflected on the source surface reaches the detector, the method comprising the following steps:

a) defining a desired distribution of a flux of source material evaporated from the source surface and an impinging distribution of electromagnetic radiation required for the desired distribution, b) determining an expected distribution of electromagnetic radiation reflected on the source surface based on the desired distribution and the impinging distribution of step a), c) providing electromagnetic radiation with the required impinging distribution defined in step a) by the electromagnetic radiation source, d) measuring electromagnetic radiation reflected on the source surface by the detector, e) determining a measured distribution of electromagnetic radiation reflected on the source surface based on the measurement data of step d), f) determining differences between the expected distribution determined in step b) and the measured distribution determined in step e), g) redetermining the required impinging distribution of electromagnetic radiation provided by the electromagnetic radiation source to minimize the differences determined in step f), and h) providing electromagnetic radiation with the required impinging distribution redetermined in step g) by the electromagnetic radiation source.

2. Method according to claim 1, wherein the desired distribution defined in step a) comprises a time dependency.

3. Method according to claim 1, wherein the expected distribution in step b) is determined by calculating the expected distribution and/or experimentally measuring the expected distribution and/or empirically estimating the expected distribution.

4. Method according to claim 1, wherein steps d) to h) are repeatedly carried out.

5. Method according to claim 1, wherein as an electromagnetic radiation light with a wavelength between 100 nm and 1400 nm is used.

6. Method according to claim 1, wherein in step e) and/or f) a response function of the detector is considered.

7. Method according to claim 1, wherein in step f) a size and/or shape of the expected distribution and the measured distribution are used for determining the differences.

8. Method according to claim 1, wherein the electromagnetic radiation source comprises two or more emitter sections, whereby in step c) and h) each emitter section provides electromagnetic radiation impinging on the source surface, and wherein the system respectively comprises two or more detectors, each detector being accordingly arranged to measure electromagnetic radiation provided by one of the emitter sections and reflected on the source surface.

* * * * *